United States Patent [19]

Bluethgen

[11] 4,453,158
[45] Jun. 5, 1984

[54] METHOD FOR ENCODING ANALOG SIGNALS

[75] Inventor: Bjoern Bluethgen, Celle, Fed. Rep. of Germany

[73] Assignee: Polygram GmbH, Hamburg, Fed. Rep. of Germany

[21] Appl. No.: 343,811

[22] Filed: Jan. 29, 1982

[30] Foreign Application Priority Data

Feb. 27, 1981 [DE] Fed. Rep. of Germany ....... 3107602

[51] Int. Cl.³ ............................................. H03K 13/24
[52] U.S. Cl. .............................. 340/347 AD; 375/27; 375/25; 340/347 M
[58] Field of Search ....... 340/347 M, 347 C, 347 AD, 340/347 DD; 375/27, 30; 179/15.55

[56] References Cited

U.S. PATENT DOCUMENTS 3,403,226  9/1968  Wintringham .................... 375/27 X
3,422,227  1/1969  Brown ............................. 358/135 X

FOREIGN PATENT DOCUMENTS 2941452  12/1979  Fed. Rep. of Germany .

OTHER PUBLICATIONS

"Digital Sound Signals: Tests to Compare the Performance of Five Companding Systems for High-Quality Sound Signals," Gilchrist, BBC–Research Department Report, 1978/26.

"Digitization of Audio: A Comprehensive Examination of Theory, Implementation and Current Practice," Blesser, J. Audio Eng. Soc., Oct. 1978, vol. 26, No. 10.

Primary Examiner—T. J. Sloyan
Attorney, Agent, or Firm—Hill, Van Santen, Steadman & Simpson

[57] ABSTRACT

A method for encoding analog signals for storage or transmission includes the steps of sampling momentary values of the analog signals and converting the sampled values into PCM code words and forming PCM differential code words from two successive PCM words, each of the differential PCM words being of a prescribed length. The length of the generated differential PCM words are continuously compared to a reference code word and upon the length of a differential code word exceeding a specified length the word is either abbreviated by a companded differential PCM word by eliminating some of the least significant code elements, or by division of the excess-length word into two successive code words respectively comprising the least significant and most significant bits of the excess-length word, the differential PCM words additionally being replaced by PCM words when the associated signal content does not exceed the length prescribed by the reference code word.

5 Claims, 7 Drawing Figures

FIG 2

| KSQ CONTROL BIT SEQUENCE | BIT NUMBER | WORD BIT SIG. | BIT GROUP WORD TYPE |
|---|---|---|---|
| 0 | | | |
| 1 | 7 | $Q_{3-9}$ | LSB-GROUP ⎫ PCM-DOUBLE WORD |
| 1 | 7 | $Q_{10-16}$ | MSB-GROUP ⎭ |
| 0 | 6+(P) | $\Delta\text{-}Q_{3-8}$ | $\Delta$PCM-COMPANDED WORD |
| 0 | 6+(P) | $\Delta\text{-}Q_{3-8}$ | $\Delta$PCM-COMPANDED WORD |
| 1 | 7 | $Q_{1-7}$ | PCM-WORD |
| 0 | 6+(P) | $\Delta\text{-}Q_{1-6}$ | $\Delta$PCM-WORD |
| 1 | 7 | $Q_{3-9}$ | LSB-GROUP ⎫ PCM-DOUBLE WORD |
| 1 | 7 | $Q_{10-16}$ | MSB-GROUP ⎭ |
| 1 | 7 | $Q_{10-16}$ | PCM-COMPANDED WORD |
| 1 | 7 | $Q_{10-16}$ | PCM-COMPANDED WORD |
| 0 | 6+(P) | $\Delta\text{-}Q_{3-8}$ | $\Delta$PCM-COMPANDED WORD |
| 1 | 7 | $Q_{1-7}$ | PCM-WORD |
| 0 | 6+(P) | $\Delta\text{-}Q_{1-6}$ | $\Delta$PCM-WORD |
| 1 | 7 | $Q_{3-9}$ | LSB-GROUP ⎫ PCM-DOUBLE WORD |
| 1 | 7 | $Q_{10-16}$ | MSB-GROUP ⎭ |
| 0 | 6+(P) | $\Delta\text{-}Q_{3-8}$ | $\Delta$PCM-COMPANDED WORD |
| ⋮ | ⋮ | ⋮ | ⋮ |
| 1 | 7 | $Q_{3-9}$ | LSB-GROUP ⎫ PCM-DOUBLE WORD |
| 1 | 7 | $Q_{10-16}$ | MSB-GROUP ⎭ |
| 0 | 6+(P) | $\Delta\text{-}Q_{3-8}$ | $\Delta$PCM-COMPANDED WORD |
| 1 | 7 | $Q_{1-7}$ | PCM-WORD |
| 0 | 6+(P) | $\Delta\text{-}Q_{1-6}$ | $\Delta$PCM-WORD |
| 0 | 6+(P) | $\Delta\text{-}Q_{3-8}$ | $\Delta$PCM-COMPANDED WORD |
| ↓ t | | | |

FIG 3 to # METHOD FOR ENCODING ANALOG SIGNALS

BACKGROUND OF THE INVENTION

1. Related Application

The subject matter of the present application is related to the subject matter of my co-pending application Ser. No. 189,595, filed on Sept. 22, 1980 and assigned to the same assignee as the present application, the teachings of which are incorporated herein by reference. My earlier application corresponds to German OS No. 29 41 452.

2. Field of the Invention

The present invention relates to methods for encoding analog signals for storage or transmission purposes, and in particular to such methods wherein the sampled momentary values of the analog signals are converted into PCM code words in an encoder and PCM differential code words ($\Delta$PCM words) are subsequently formed from two successive PCM words by means of differential formation and wherein each of the $\Delta$PCM words representing a pulse group, together with at least one auxiliary code element, form a code word of a prescribed length corresponding to the length of a reference code word.

As described in my co-pending application Ser. No. 189,595, uniformly quantized pulse code modulation negatively effects the quality of encoded analog signals which are stored or transmitted. In order to reduce the number of elements of the code words, so-called differential pulse code modulation can be used in which only the amplitude changes of successive momentary values of the analog signal are stored or transmitted in digitally encoded form. Within specified quality demands, the number of code elements thereby arising per $\Delta$PCM word is determined by the maximum possible change of the amplitude between two successive momentary values of the analog signal. This permits the possibility of reducing the transmission or storage capacity of the transmitting or storage medium for the reason that the number of code elements in a code word is selected only as large as is respectively necessary for the representation of the particular momentary value. Such reduction, however, requires additional code elements in each word which, given differing word length, can be lost due to bit errors, resulting in errors when the original analog signal is regained. For this reason PCM redundancy reduction methods usually employ a constant number of code elements for the respective transmission of the momentary signal values, the number of code elements being reduced in comparison to a maximum value which would exist for uniform quantization. The binary encoded momentary values, identified by means of appropriate additional code elements, are transmitted, either individually or in blocks, in companded form. This method, however, results in the undesirable dependency of the quality of the regained analog signal on the degree of companding.

In order to avoid the undesirable dependency of the quality of the regained analog signal on the degree of companding for the purpose of transmitting or storing digitally encoded analog signals even given the use of a reduced constant code element group per code word for each momentary value, the method disclosed in my earlier application Ser. No. 189,595 further reduces the digital signal flow by selecting the reference code word, including the auxiliary code elements, to be shorter than the maximum possible length of a $\Delta$PCM word and continuously compares the length of the generated $\Delta$PCM words to the reference code word. Only upon the detection of a $\Delta$PCM word of excess length is the excess-length word sufficiently abbreviated by means of either eliminating some of the least significant code elements, thereby forming a companded $\Delta$PCM word, or by replacing the excess-length word by a PCM word of suitable length.

The PCM word of suitable length in the method of my earlier application is formed either by eliminating the least significant code elements or by dividing the code elements into two successive code words, forming a PCM double code word, which respectively comprise the least significant and most significant bits of the excess-length word.

Because large amplitude changes occur with limited and irregular distribution in analog signals, such as voice and music signals, conversion of the excess-length $\Delta$PCM words into PCM words of suitable lengths has substantially no effect in reducing the quality of the regained original analog signal. Disadvantages may occur, however, if a continuous transmission of such a reduced digital signal flow is disrupted by, for example, brief interruptions of the signal flow on the transmission path. Because essentially only signal differences in the form of $\Delta$PCM words are transmitted, each signal flow interruption effects an error propagation in the subsequent signal flow which can only be corrected when a PCM double word is transmitted which, in effect, represents a signal reference value.

SUMMARY OF THE INVENTION

It is an object of the present invention to improve the method disclosed in my earlier application Ser. No. 189,595 such that error propagations occurring as a result of brief signal flow interruptions are substantially avoided while the high quality of the regained analog signal is retained.

This object is inventively achieved in an improvement over the method disclosed in my co-pending application Ser. No. 189,595 wherein $\Delta$PCM words are additionally replaced by PCM words in the train of the reduced signal flow when the associated signal content, including the required auxiliary code elements, does not exceed the word length which is set by the reference code word.

The subject matter of the improvement is based on the perception that the number of signal reference values occurring in the signal flow significantly increases as a result of the additional transmission of linearly-encoded PCM words in place of $\Delta$PCM words whenever this is possible. Error propagation given brief signal flow interruptions is thus simultaneously excluded with certainty over a larger number of code words. For further decreasing error propagation, my earlier method can be improved by replacing a $\Delta$PCM word with a PCM double word when the two PCM words from which the $\Delta$PCM word is to be derived have approximately the same signal content which, including the necessary auxiliary code elements, exceeds the word length prescribed by the reference code word.

The transmission of a number of different types of code words which are generated according to the principles of the method disclosed and claimed herein would normally require at least two auxiliary code elements for their respective identification, which would be counter to the desired reduction of the digital signal flow. In order to avoid this undesired effect, a control bit sequence with a single-bit allocation per code word is employed to identify the type of code word occurring in the reduced signal flow, namely ΔPCM words, companded ΔPCM words, PCM words, companded PCM words and PCM double words. The control bit sequence is generated simultaneously with the reduced-length code words in the train of the reduced digital signal flow by the use of logic linkages in combination with a predetermined control of the sequence of the types of code words. Decoding at the end of a transmission chain is undertaken as a function of the prescribed sequence sub-patterns.

In a preferred embodiment, a PCM word occurring in the train of the reduced digital signal flow is identified in the control bit sequence by means of one bit which is preceded as well as followed by an inverse bit. These inverse bits thereby flag a ΔPCM word or a companded ΔPCM word preceding and following the PCM word.

Given a PCM double word occurring in the train of the reduced digital signal flow, it is further preferable to place the least significant bit (LSB) group in front of the most significant bit (MSB) group and for such a PCM double word to always follow a ΔPCM word or a companded ΔPCM word and for a ΔPCM word or a companded ΔPCM to always follow a PCM double word. If it is required by the form of the analog signal, at least one companded PCM or one ΔPCM word, or one companded ΔPCM word follows a PCM double word. Thus, in the control bit sequence, the LSB group and the MSB group of the PCM double word and the one or more companded PCM words are respectively flagged by an identical bit and the ΔPCM word or the companded ΔPCM word is flagged by means of a bit which is inverse with respect thereto.

Because the transmission of linearly encoded PCM words always indicates a small signal amplitude of the momentary sampled signal, it is preferable to have at least one ΔPCM word follow a PCM word in the train of the reduced digital signal flow.

DESCRIPTION OF THE PREFERRED EMBODIMENTS

Figure 1:
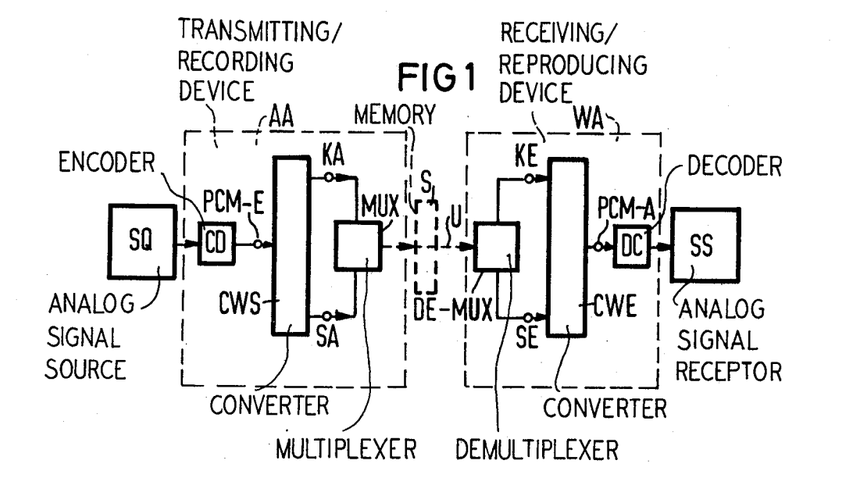
FIG. 1 is a block diagram representing a system for practicing the method disclosed and claimed herein.

A system for practicing the method disclosed and claimed herein is schematically shown in FIG. 1 consisting basically of a transmitting/recording device AA and a corresponding receiving/reproducing device WA. A signal source of analog signals, such as a music or speech source, is referenced at SQ, which is connected at its output to the input of an encoder CD in the device AA. In the encoder CD, the analog signal is sampled at a frequency of, for example, 32 kHz and the samples are converted into PCM words with, for example, 16 code elements per value. The PCM signal generated in this manner is supplied to the input PCM-E of a post-connected transmission-side code converter CWS which is described in greater detail below. The code converter CWS undertakes the desired reduction of the digital signal flow forming a sequence of code words having a number of code elements such as, 8 code elements corresponding to a 50% reduction. Whatever the number of code elements in the reduced digital signal flow, the code words are significantly shorter than the PCM words supplied to the input of the converter CWS.

The converted code words occur at the output SA of the converter CWS in the form of ΔPCM words, companded ΔPCM words, PCM words, companded PCM words, and PCM double words and are appropriately flagged by means of a control bit sequence which is simultaneously generated in the code converter CWS and which occurs at the output KA of the converter CWS. One bit of the control bit sequence at the output KA is allocated to each code word at the output SA.

A multiplexer MUX follows the code converter CWS in which the code words at the output SA are respectively augmented by means of the bit of the control bit sequence at the output KA which is associated therewith and are thus placed in the proper code element format which corresponds to a format determined by a preselected reference code word.

Figure 2:
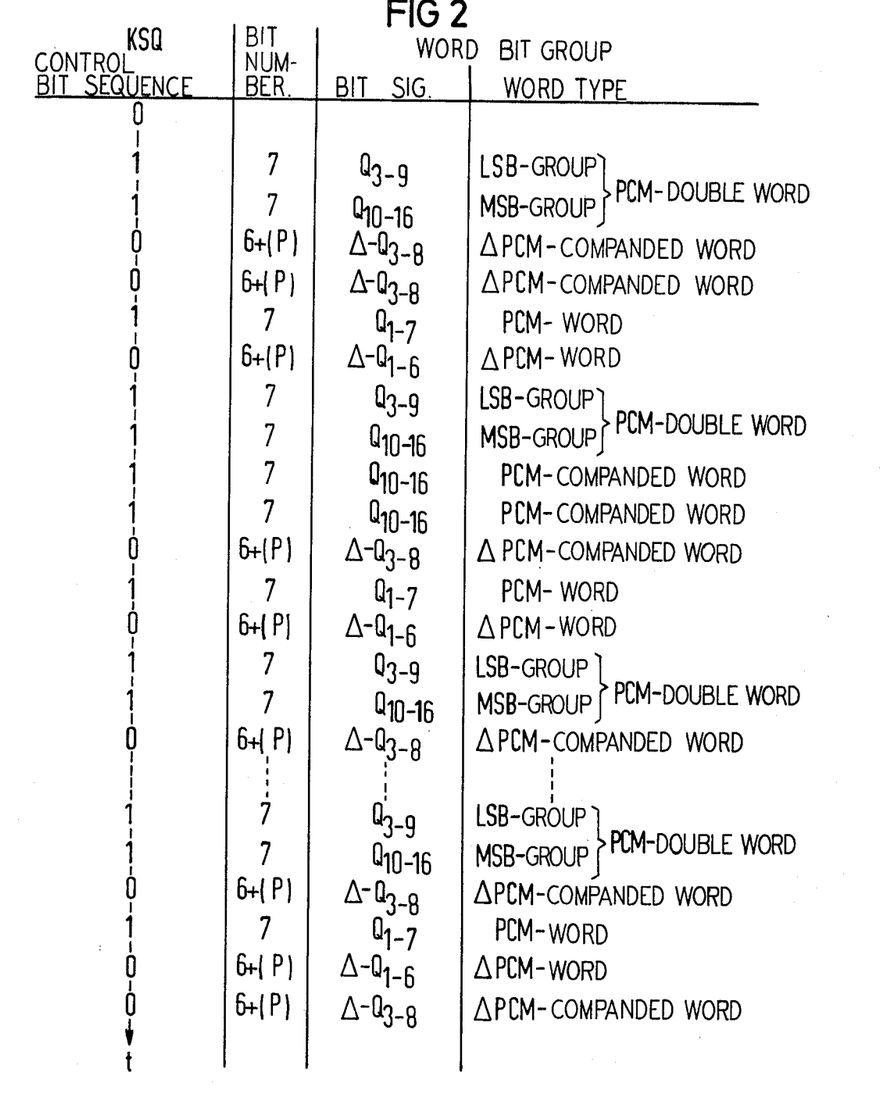
FIG. 2 is a chart showing an example of a control bit sequence with the associated word bit groups.

The reduced digital signal flow generated by the transmitting/recording device AA is supplied to the receiving/reproducing device WA across a transmission path U, which may include a memory S or may be simply a direct transmission line. In the device WA, the original analog signal is regained from the reduced digital signal flow in essentially the reverse of the operations undertaken in the device AA. To this end, the received code words are first separated in the demultiplexer DE-MUX from the control bit sequence. The portions of the transmitted code words corresponding to the signal content of the transmitted words are supplied to the input SE of a receiving-side converter CWE, and the separated control bit sequence is supplied to the input KE of the converter CWE. The regained PCM words are supplied from the output PCM-A of the converter CWE to a decoder DC which is in turn connected at its output side to an analog signal receptor SS. The table shown in FIG. 2 illustrates a sample embodiment of a succession of code words in a 50% reduced digital signal flow in their respective allocation to one bit of the control sequence. Each entry represents a reference code word of 8 code elements, including the bit of the control bit sequence, and a code element plurality of code words occurring at the output of the encoder CD of the device AA shown in FIG. 1, consisting of 16 code elements. The successively following bits of the control bit sequence KSQ are indicated in the first column. A "0" signifies a binary zero and a "1" signifies a binary one. The further three columns provide more detailed information concerning the respective word bit groups selected in the example, identifying the bit number, the bit significance, and the type of word.

In the exemplary sequence shown in FIG. 2, a PCM double word occurs at the beginning. Such a double word is transmitted in the reduced digital signal flow in two successive code words, that is, the group with the least significant bit elements, the so-called LSB group, being generated first and the group with the most significant bit elements, the so-called MSB group, is generated subsequently. In the column indicating the bit significance, the significance Q of the bits is shown by the subscripts following the letter Q. $Q_{3-9}$ indicates that, given suppression of the least significant bits $Q_1$ and $Q_2$, the next more significant bits $Q_3$ through $Q_9$ of the original PCM word form the LSB group. The MSB group then is comprised of the bits of significance $Q_{10}$ through $Q_{16}$. Thus, each word bit group comprises 7 code elements to one respective bit of the control bit sequence KSQ is allocated, whereby the format of the reference code word prescribed by 8 code elements is filled. The two groups of a PCM double word are respectively flagged with a "1" in the control bit sequence KSQ. According to the inventive method, the ΔPCM words or the companded ΔPCM words occurring in the reduced digital signal flow are always flagged by means of a "0". Because a ΔPCM word always requires a bit "P" indicating the polarity, the absolute differential value can only be represented, in view of the format prescribed by the reference code word, with 6 code elements.

As shown in FIG. 2, the first PCM double word is followed by a companded ΔPCM word with the bit significance $Q_{3-8}$. In order to identify the differential value, a polarity bit precedes the bit significance. The next word is also a companded ΔPCM word. A PCM word with the bit significance $Q_{1-7}$ is transmitted as the fifth code word. This means that the momentary signal value from which the fifth code word was generated is so small that it can be fully represented with the first 7 bits in the significance allocation. The associated bit of the control bit sequence KSQ is again a "1" in this case. Such a PCM word, however, can only be generated in the train of the code word sequence when a ΔPCM word or a companded ΔPCM word flagged by means of a "0" in the control bit sequence KSQ precedes the word as well as follows the word. In other words, the PCM word is flagged here by the "1" in the control bit sequence succession 0 1 0.

Because the PCM word indicates a low momentary signal value, the following ΔPCM word forced by the control bit sequence is not generated in companded form. A PCM double word again appears as the sixth word, which is followed by two companded PCM words. In other words, companded PCM words are flagged in the control bit sequence KSQ such that they always appear with a "1" following a PCM double word. The further code words occurring in sequence in the table shown in FIG. 2 are self-explanatory.

It should also be noted that the companded ΔPCM words occurring in conjunction with and after a PCM double word, and flagged in the control bit sequence KSQ with a "0", may be defined as companded ΔPCM words whose companding degree depends on the respective relevant momentary value range of the signal amplitude. Because the inventive method has the ability to generate ΔPCM words in companded and noncompanded form as a function of the momentary signal behavior, it is possible to optimize the relationship of PCM and ΔPCM words according to the audio-psychological threshold value criteria.

Figure 3:
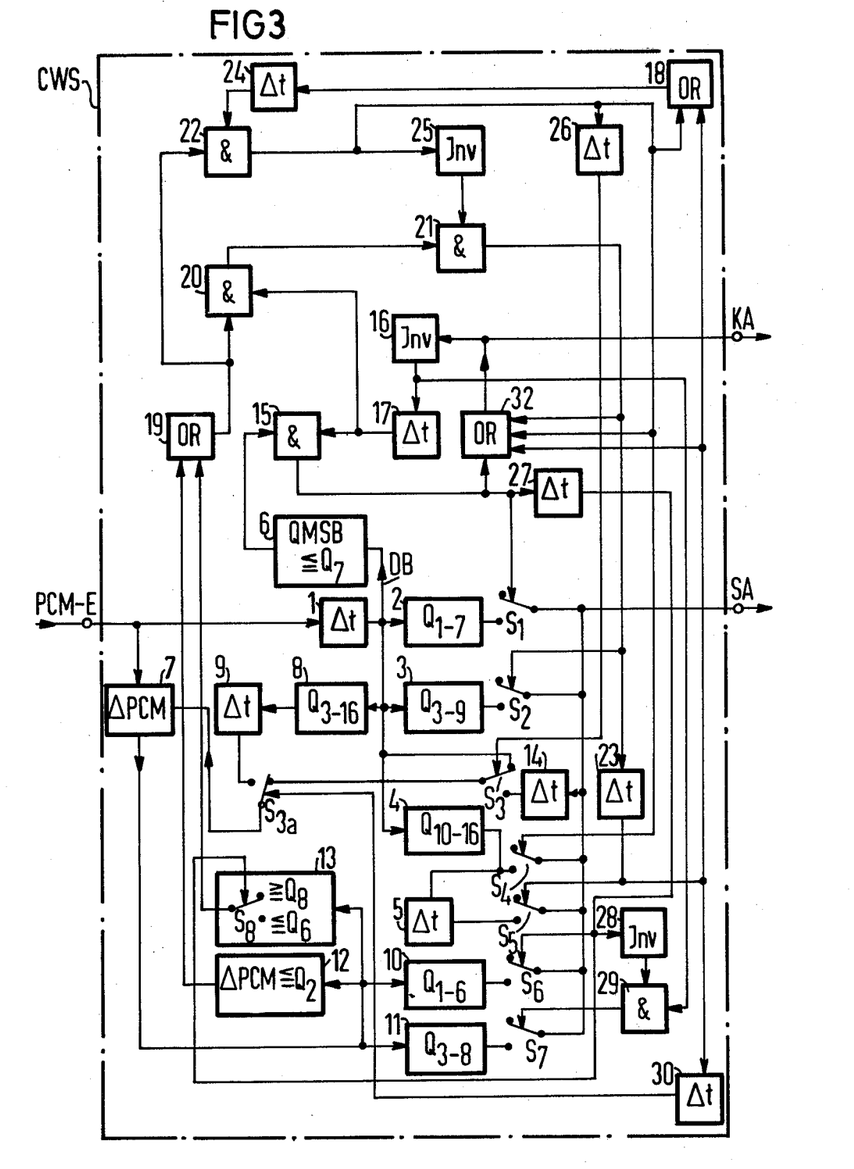
FIG. 3 is an embodiment of a code converter of the type shown in FIG. 1 on the transmission side.

A sample embodiment of the transmission-side code converter CWS is shown in FIG. 3 which a circuit design for a 50% reduced digital signal flow in which a word sequence is generated in conjunction with a control bit sequence as has been explained on the basis of the table shown in FIG. 2.

To this end, the circuit shown in FIG. 3 has a series of code element group selection stages 2, 3, 4 and 8. A direct connection from a data bus DB carrying the code word with 16 code elements $Q_{1-16}$ is directly connected through the respective stages 2, 3, 4 and 8 to the following circuit elements only for the code elements correspondingly identified in each of the respective code elements group selection stages. Accordingly, a direct signal line from the data bus DB to the output of the code element group selection stage 2 occurs only for the code elements with the bit significance $Q_{1-7}$, to the output of the code element group selection stage 3 only for the code elements with the bit significance $Q_{3-9}$, to the output of the code element group selection stage 4 only for the code elements with the bit significance $Q_{10-16}$, and to the output of the code element group selection stage 8 only for the signals of the data bus code element group with the bit significance $Q_{3-16}$.

The PCM code words having 16 bits and arriving at the input PCM-E are supplied to the code element group selection stages 2, 3, 4 and 8 via a time delay stage 1 with a time delay Δt, which is here selected equal to a PCM code word period. The words are also supplied to the data bus DB through the time delay stage 1. In order to form the ΔPCM words, the PCM words incoming at the input side are simultaneously supplied to an input of the PCM code word differential stage 7. The ΔPCM words at the output of the PCM code word differential stage 7, in a selective signal line configuration for the code elements of the bit significance $Q_{1-6}$ or $Q_{3-8}$ identified by the code element group selection stages 10 and 11, are supplied to switches S6 and S7 and are also directly supplied to the binary code word comparison stages 12 and 13. The binary code word comparison stages 12 and 13 correspond, for example, to logic modules of the type manufactured by RCA designated CD 4063 B, and are connected in series. The comparison stages determine whether a binary code word is "greater than," "smaller than" or "equal to" the reference code word. At the output side, the code element group selection stages 2, 3, 4, 10 and 11 are connected to the switches S1, S2, S4, S6 and S7 which are connected to the output SA of the converter CWS.

In its idle position, the switch S3 connects the data bus DB via the normally-closed contact of the switch S3a to the second input of the PCM code word differential stage 7. In the operating position of the switch S3, the second input of the PCM code word differential stage 7 is connected to the output SA via the time delay element 14 with a time delay Δt. In its operating position, the switch S3a in turn connects the second input of the PCM code word differential stage 7 to the output of the code element group selection stage 8 via a time delay stage 9 having a time delay Δt. In its operating position, the switch S5, which is also connected to the output SA with its wiper, connects the output of the code element group selection stage 4 to the output SA via the time delay stage 5, having a time delay Δt.

The binary code word comparison stage 12 evaluates the ΔPCM words from the output of the PCM code word differential stage 7 for determining whether a ΔPCM word is equal to or smaller than the bit significance $Q_2$. In its idle position, the binary code word comparison stage 13 emits a control signal via the internal switch S8 when the most significant bit of the respective ΔPCM word is equal to or greater than $Q_8$. In its operating position, the binary code word comparison stage 13 emits a control signal via the internal switch 8 when the most significant bit of the ΔPCM word occurring at the input side is smaller than or equal to $Q_6$. A further binary code word comparison stage 6 is connected to the data bus DB and emits a control signal when the most significant bit exhibiting a binary "1" of a 16 bit PCM code word supplied via the input PCM-E is smaller than or equal to the binary significance $Q_7$.

The binary word comparison stages 6, 12 and 13 operate in combination with AND gates 15, 20, 21, 22 and 29, OR gates 18, 19 and 32, time delay stages 17, 23, 24, 26, 27 and 30, each having a time delay of $\Delta t$, and with inverters Inv 16, 25 and 28 as a logical linkage for generating the control bit sequence KSQ which is emitted at the output KA. Simultaneously and in conjunction therewith the switches S1, S2, S3, S3a, S4, S5, S6, S7 and S8 are driven for emitting the code word sequence in reduced form at the output SA.

Figure 4:
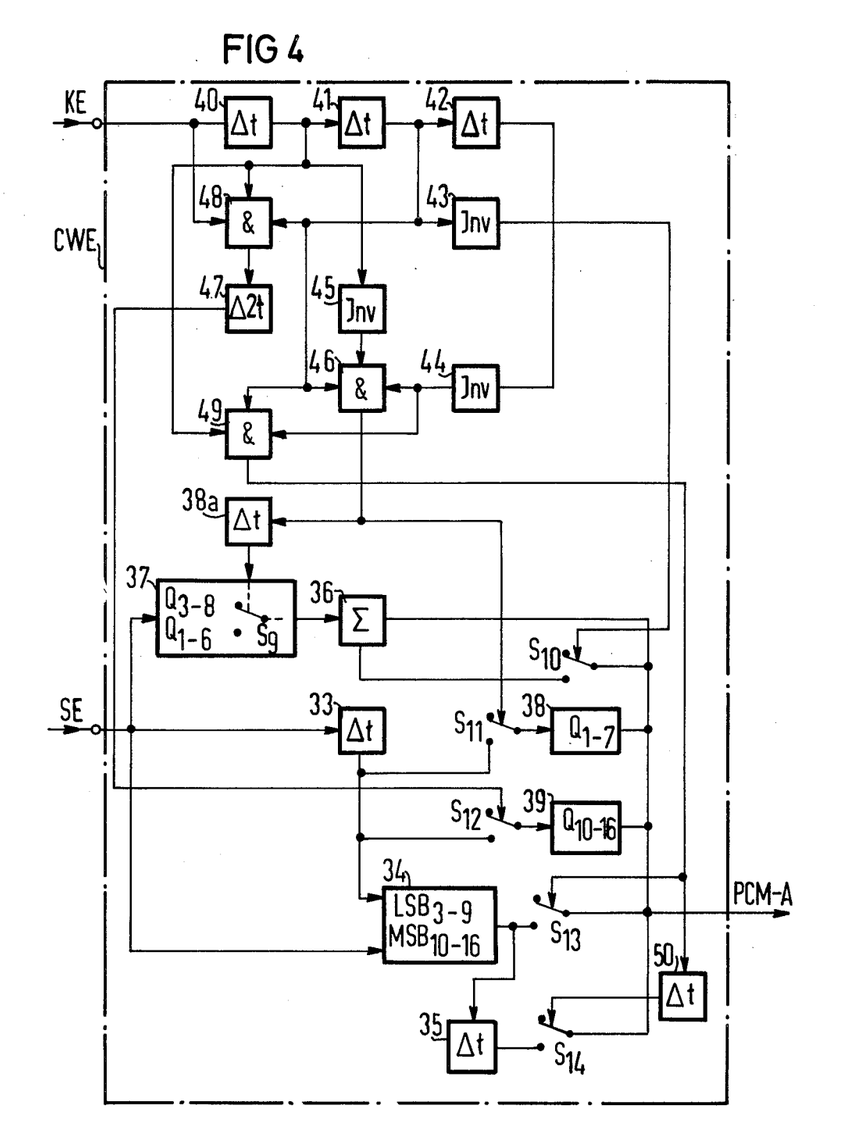
FIG. 4 is an embodiment of a code converter shown in FIG. 1 at the receiving side.

A circuit diagram for a reception-side code converter CWE, corresponding to the transmission-side code converter CWS, is shown in FIG. 4. The code words of the reduced digital signal flow arriving at the input SE are supplied to switches S11 and S12, as well as to the first input of a PCM signal formating stage 34 via a time delay stage 33 with a time delay $\Delta t$. At the same time, the PCM signal formating stage 34 receives an undelayed code word from the input SE via its second input. At the output side, the PCM signal formating stage 34 is connected to the output PCM-A of the converter CWE, being directly connected thereto via a switch S13 and being indirectly connected thereto via a time delay stage 35, with a time delay of $\Delta t$, and a switch S14.

In the operating position of the switch S11, the code words in coming at the output of the time delay stage 33 are connected to the input of a code word content value assignment stage 38 for the bit group $Q_{1-7}$ and, in the operating position of the switch S12, are connected to the input of a further code word content value assignment stage 39 for the bit group $Q_{10-16}$. At the output side, the code word content value assignment stages 38 and 39 are connected to the output PCM-A. Additionally, the output PCM-A is connected to an input of a summing stage 36 when the switch S10 is in its operating position. The output of the summing stage 36 is connected to the output PCM-A. A second input of the summing stage 36 is connected to the input SE via a quantization stage evaluator 37 which undertakes a quantization evaluation when its internal switch S9 is in its idle position. The quantization evaluation is made as a function of whether, after a PCM code word corresponding to the allocated control bit sequence identification supplied to the output PCM-A, the digital signal value does not exceed the significance of the bit element $Q_7$. Therefore, the actuation of the switch S9 occurs with a time lag via a time delay stage 38a having a time delay of $\Delta t$.

Control of the switches S9 through S14 in turn is undertaken in combination with a logic circuit evaluating the control bit sequence at the input KE, the logic circuit consisting of AND gates 46, 48 and 49, inverters Inv 43, 44 and 45, and time delay stages 40, 41 and 42 each having a time delay of $\Delta t$, which are connected in series behind one another relative to the in coming control bit sequence.

Figure 5:
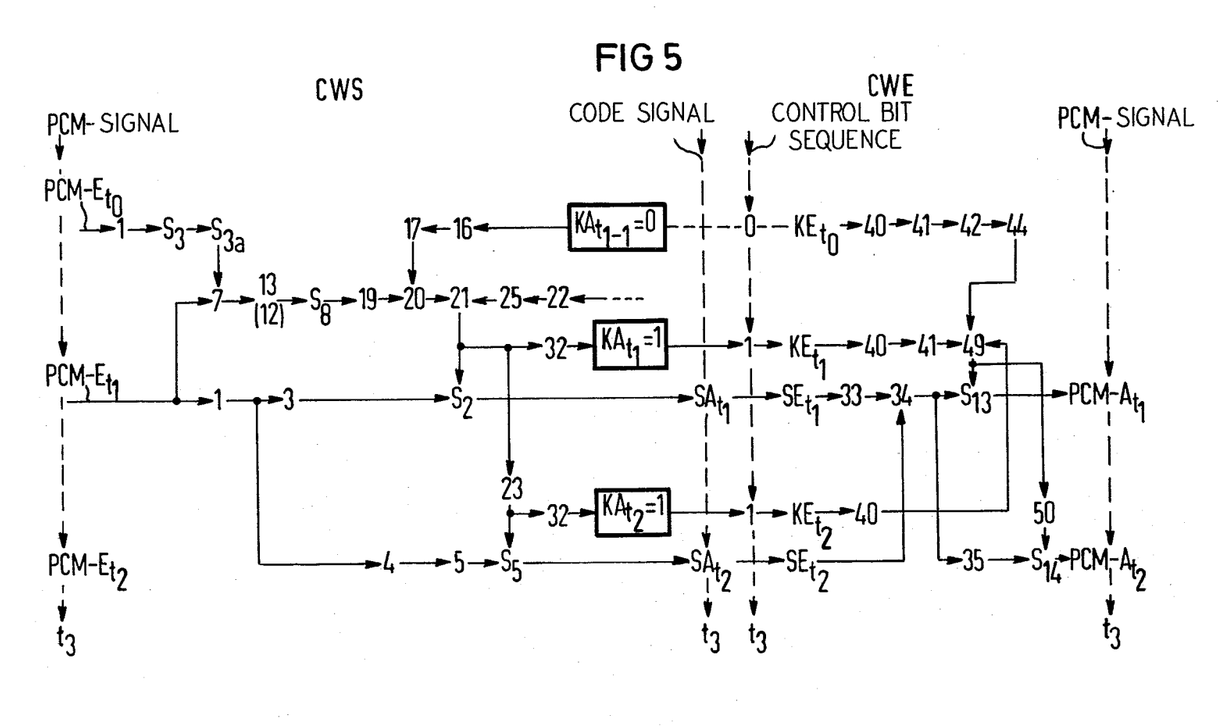
FIGS. 5 through 7 are function sequence diagrams explaining the manner of operation of the code converters at the transmission and receiving sides of FIG. 1 in greater detail.
Figure 6:
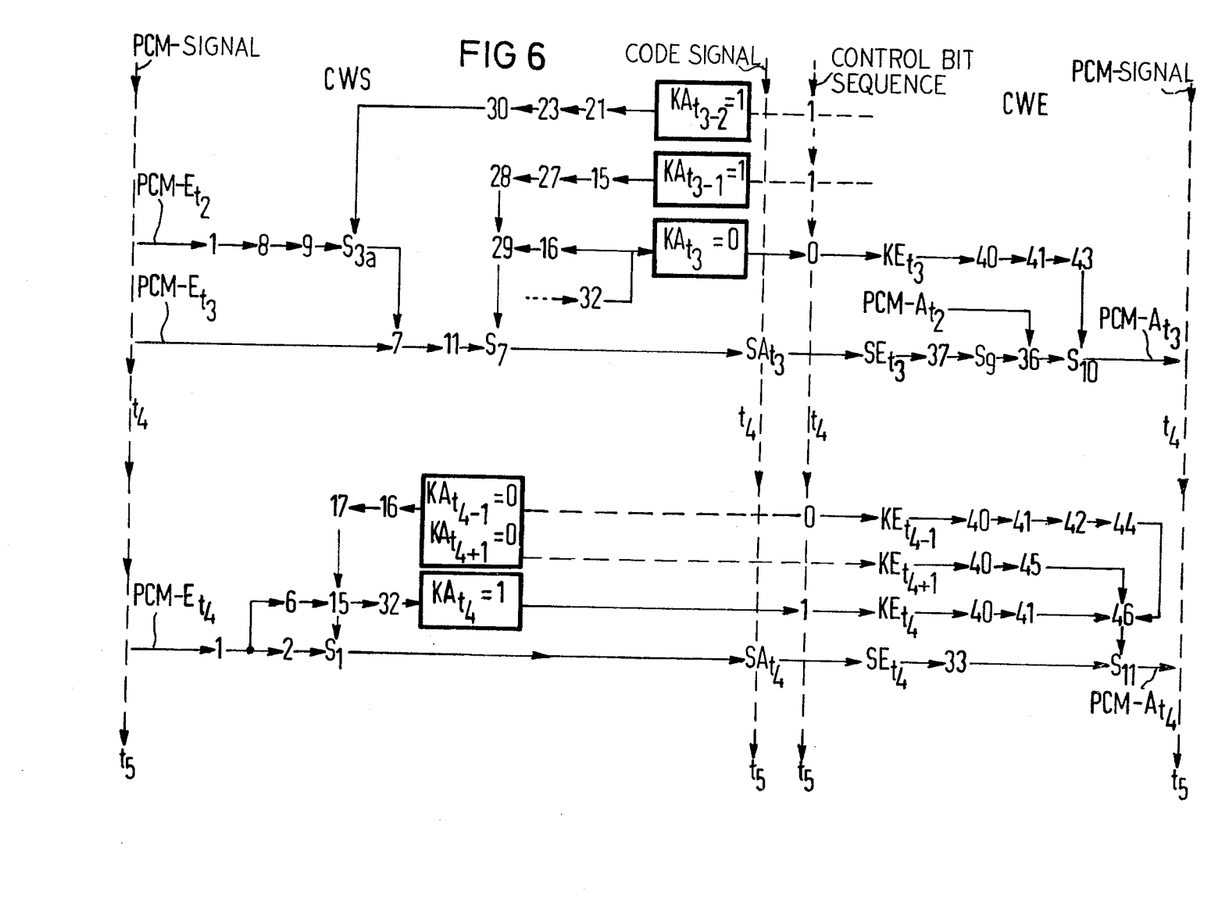
Figure 7:
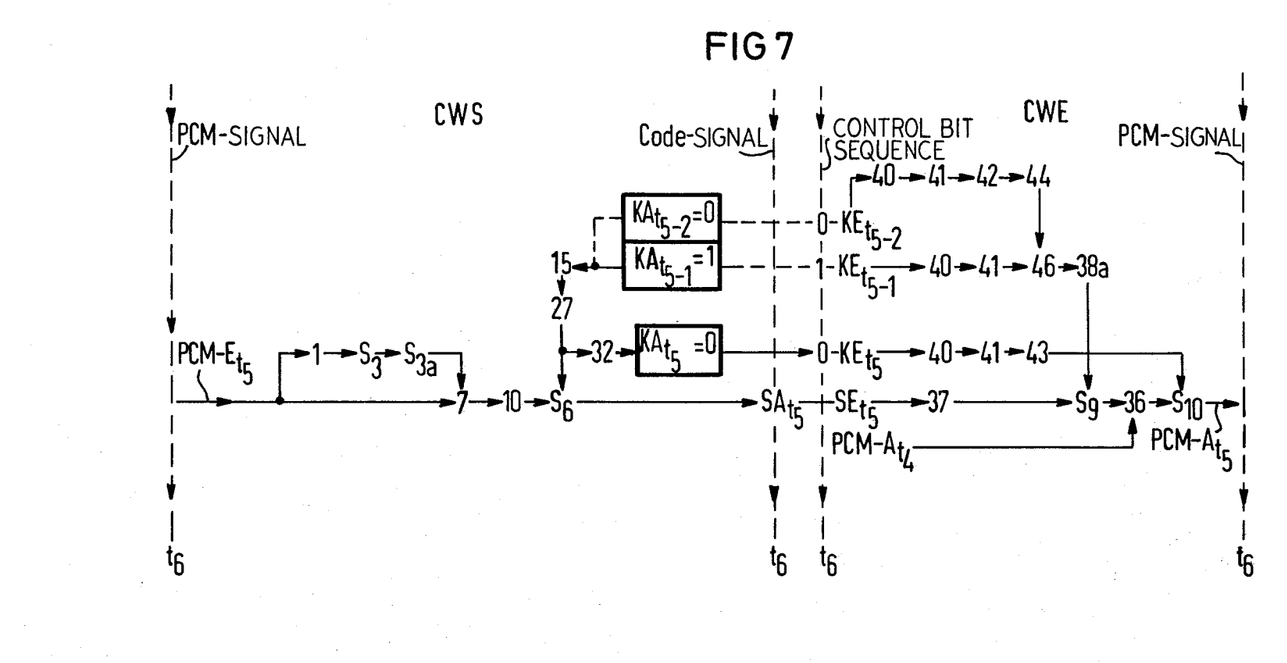

For the purpose of explaining the manner of operation of the transmission-side code converter CWS and the reception-side code converter CWE shown in FIGS. 3 and 4, several work function diagrams are shown in FIGS. 5, 6 and 7, which also refer to the table illustrated in FIG. 2. The work function diagrams are constructed in such a manner that the work function of the transmission-side code converter CWS is illustrated at the left side and the work function of the reception-side code converter CWE is illustrated at the right side. The input-side PCM signal at the input PCM-E of the converter CWS, the output side code signal at the output SA and at the input SE of the converter CWE, the control bit sequence at the output KA of the converter CWS and at the input KE of the converter CWE, and the PCM signal at the output PCM-A are respectively shown in the work function diagrams of FIGS. 5 through 7 by means of vertical broken lines. The inputs and outputs are additionally provided with time step indications $t_i$ which illustrate the chronological sequence of the successive code word spacings relative to the PCM signal at the input PCM-E of the converter CWS.

The work function diagram shown in FIG. 5 first shows the generation of a PCM double word corresponding to the first word shown in the table in FIG. 2, proceeding from the fact that, corresponding to the prescribed patterns of the control bit sequence, a ΔPCM word flagged by a "0" has been generated. The PCM code word to be converted at the input PCM-E at point in time $t_1$ is directly supplied to one input of the PCM code word differential stage 7 and is also supplied to the output $SA_{t1}$ via the time delay stage 1, the code element group selection stage 3, and the switch S2. Additionally, behind the time delay stage 1, this PCM word is supplied to the output $SA_{t2}$ via the code element group selection stage 4, the time delay stage 5, and the switch S5. For generating the ΔPCM word at the output of the PCM code word differential stage 7, the PCM code word occurring at the output PCM-E at point in time $t_0$ is supplied to the second input of the stage 7 via the time delay stage 1, the switch S3, and the switch S3a.

The actuation of the switch S2 occurs across the PCM code word differential stage 7 by means of activation of the binary code word comparison stages 13 or 12, the switch S8, the OR gate 19, the AND gate 20, and the AND gate 21. To this end, the AND gate 20 receives the break pulse at its second input via the inverter 16 and the time delay stage 17 as a result of the "0" in the control bit sequence at the point in time $t_{1-1}$. In the same manner, the AND gate 21 receives the break pulse at its second input via the AND gate 22 and the inverter 25.

The "1" of the control bit sequence flagging the LSB group at the output $KA_{t1}$ and the MSB group at the output $KA_{t2}$ is obtained in the former case from the output of the AND gate 21 via the OR gate 32, and in the latter case via the AND gate 21, the time delay stage 23 and the OR gate 32.

The PCM code word occurring at the input PCM-E at point in time $t_2$ is suppressed, because space no longer exists for this code word in the reduced digital signal flow because of the generation of a PCM double word. At the output side of the converter CWE, this suppressed PCM code word is compensated by means of a double output of the 16 bit PCM code word regained from the PCM double word at the output PCM-$A_{t1}$ and at the output PCM-$A_{t2}$.

As shown in FIG. 5 at the receiving side code converter CWE, the bits of the control bit sequence 0 1 1 are successively supplied to the iteratively connected time delay stages 40, 41 and 42 shown in FIG. 4. The LSB group at the input SE$_{t1}$ of the code converter CWE is supplied via the time delay stage 33 to one input of the PCM signal formating stage 34. At the same time, the MSB group of the PCM double word is supplied at the other input of the PCM signal formating stage 34 via the input SE$_{t2}$. The PCM signal formating stage 34 then forms the original 16 bit PCM word from the two groups, emitting the 16 bit PCM code word via the switch S13 to the output PCM-A$_{t1}$. The same 16 bit PCM code word is supplied to the output PCM-A$_{t2}$ via the time delay stage 35 and the switch S14.

For clarity the components of the transmission side converter CWS, the reception side code converter CWE, and the switches are indicated in the work function diagram of FIG. 5, as well as in the other work function diagrams of FIGS. 6 and 7, by means of the reference numerals which identify those components.

The upper work function diagram shown in FIG. 6 describes the generation of a companded ΔPCM word after a PCM double word according to the table shown in FIG. 2 for the transmission side code converter CWS and the reception side code converter CWE. This ΔPCM word companded in the selected example is thereby formed in the converter CWS from the difference of the PCM words at the inputs PCM-E$_{t2}$ and PCM-E$_{t3}$. In the reception side code converter CWE, the PCM word at the output PCM-A$_{t3}$ is regained by addition with the PCM word at the output PCM-A$_{t2}$ in the summing stage 36.

The lower work function diagram of FIG. 6 shows the generation of the fourth code word in the table shown in FIG. 2 in the form of a PCM word, as well as the conversion thereof in the reception side code converter CWE. The associated bit of the control bit sequence is thus again a "1", which is preceded as well as followed in the control bit sequence by a "0".

In the same manner, the work function diagram shown in FIG. 7 shows the generation of a non-companded ΔPCM word in conjunction with and following the PCM word according to the table in FIG. 2, as well as the conversion thereof into the original, non-companded PCM word in the reception side code converter CWE. The associated bit of the control bit sequence is a "0" which is directly preceded in the control bit sequence by a "1" with an additional leading "0".

Although modifications and changes may be suggested by those skilled in the art it is the invention of the inventor to embody within the patent warranted hereon all such changes and modifications as reasonably and properly come within the scope of his contribution to the art.

I claim as my invention:

1. In a method for encoding analog signals for transfer thereof in digital form for reducing the digital signal flow comprising the steps of;
sampling momentary values of said analog signal;
converting the sampled momentary values of said analog signal into a series of pulse code modulated code words;
forming a corresponding series of pulse code modulated differential code words from pairs of successive pulse code modulated code words in said series, each pulse code modulated differential code word together with at least one auxiliary code element forming a reference code word having a predetermined constant length which is selected to be less than a maximum possible length of a pulse code modulated differential code word;
constantly comparing the respective lengths of the combination of said pulse code modulated differential code word together with said auxiliary code element with the length of said reference code word; and
abbreviating a pulse code modulated differential code word compared with said reference code word when the length of said combination exceeds the length of said reference code word by generating a companded differential pulse code modulated word by eliminating a selected number of the least significant code elements of the excess-length pulse code modulated differential code word, or by forming a pulse code modulated double word consisting of two words respectively comprising the least significant and most significant code elements of the excess-length pulse code modulated differential code word;
the improvement comprising the steps of:
additionally replacing pulse code modulated differential code words by pulse code modulated words when the signal content of the pulse code modulated differential code words including the auxiliary code elements does not exceed said reference code word; and
flagging the type of code words occurring in the reduced digital signal flow with a control bit sequence in which a single bit allocation per word is employed, said control bit sequence being generated in the train of said reduced digital signal flow by a logic means simultaneously with the code words replacing said excess-length code words, said control bit sequence controlling the succession of types of code words as well as decoding of said code words after transfer thereof.

2. The improvement of claim 1 comprising the additional step of replacing a differential pulse code modulated code word with a pulse code modulated double word when said two successive pulse code modulated words from which said pulse code modulated differential word was formed have substantially equal signal content which, including said auxiliary code elements, exceeds said reference code word.

3. The improvement of claim 1 wherein at least one pulse code modulated differential code word always follows a pulse code modulated word.

4. The improvement of claim 1 wherein a pulse code modulated word occurring in the train of the reduced digital signal flow is flagged in said control bit sequence by a binary "1" which is both preceded and followed by a binary "0", said binary "0" flagging a pulse code modulated differential code word or a companded pulse code modulated differential code word preceding and following said pulse code modulated word.

5. The improvement of claim 4 wherein the generation of said pulse code modulated double word in said reduced digital signal flow is further defined by first generating said least significant bit group followed by generation of said most significant bit group, and wherein said pulse code modulated double word always follows a pulse code modulated differential word or a companded pulse code modulated differential word and wherein said pulse code modulated double word is always followed by either a pulse code modulated differential code word or a companded pulse code modulated differential code word, said least significant bit group and said most significant bit group of said pulse code modulated double word being flagged in said control bit sequence by a binary "1" and said pulse code modulated differential code word or said companded pulse code modulated differential code word being flagged by a binary "0".

* * * * *